(12) United States Patent
Kokubu et al.

(10) Patent No.: US 6,987,387 B2
(45) Date of Patent: Jan. 17, 2006

(54) MEASUREMENT VALUE OUTPUT DEVICE, MEASUREMENT VALUE MONITORING DEVICE, CURRENT VALUE OUTPUT DEVICE AND CURRENT MONITORING DEVICE

(75) Inventors: Takao Kokubu, Kodaira (JP); Norimichi Uchida, Kodaira (JP)

(73) Assignee: Kabushiki Kaisha Bridgestone, Tokyo (JP)

( * ) Notice: Subject to any disclaimer, the term of this patent is extended or adjusted under 35 U.S.C. 154(b) by 0 days.

(21) Appl. No.: 10/501,479

(22) PCT Filed: Jan. 28, 2003

(86) PCT No.: PCT/JP03/00770

§ 371 (c)(1),
(2), (4) Date: Aug. 10, 2004

(87) PCT Pub. No.: WO03/065059

PCT Pub. Date: Aug. 7, 2003

(65) Prior Publication Data
US 2005/0052264 A1 Mar. 10, 2005

(30) Foreign Application Priority Data
Jan. 30, 2002 (JP) .............................. 2002-021170
Apr. 4, 2002 (JP) .............................. 2002-102912

(51) Int. Cl.
*G01R 31/08* (2006.01)
*G01R 19/00* (2006.01)

(52) U.S. Cl. .................................. 324/522; 324/76.11
(58) Field of Classification Search ................ 324/522, 324/512, 500, 617, 415, 423, 532, 535, 605, 324/607; 702/1, 57, 79, 126, 127, 176, 177, 702/189, 198, 149
See application file for complete search history.

(56) References Cited

U.S. PATENT DOCUMENTS
4,134,258 A * 1/1979 Hobo et al. ................... 60/790

(Continued)

FOREIGN PATENT DOCUMENTS
EP    1 132 744 A2    9/2001

(Continued)

OTHER PUBLICATIONS

Microfilm of the specification and drawings annexed to the request of Japanese Utility Model Application No. 24302/1981 (Laid-open No. 140421/1982) (Akai Electric Co., Ltd.) Sep. 2, 1982.

*Primary Examiner*—Anjan Deb
*Assistant Examiner*—Hoai-An D. Nguyen
(74) *Attorney, Agent, or Firm*—Oliff & Berridge PLC

(57) ABSTRACT

A measurement value output device including measuring unit such as current measuring unit (11) for metering an AC current running through the power line (2) of a motor (1), a detection circuit (12) for detecting the above measurement value by amplifying the above measured current value, a signal converting unit (13) for converting the detected measurement value into a time interval (duration) and an ON/OFF signal output unit (14) for outputting an ON/OFF signal which is kept ON or OFF for the above time interval at predetermined time intervals and outputs the measurement value such as the motor current of a production line used to monitor a measurement value at predetermined time intervals as a pulse signal (digital signal) having a pulse width corresponding to the above measurement value at predetermined time intervals.

16 Claims, 11 Drawing Sheets

U.S. PATENT DOCUMENTS

| | | | |
|---|---|---|---|
| 4,158,809 A | * | 6/1979 | Dellamano .................. 324/99 D |
| 4,158,884 A | * | 6/1979 | McKinley et al. ........... 701/100 |
| 4,255,789 A | * | 3/1981 | Hartford et al. ............ 701/108 |
| 4,550,308 A | * | 10/1985 | Tokura et al. ............... 341/167 |
| 4,749,878 A | * | 6/1988 | Snyder et al. ............... 327/114 |
| 4,844,469 A | * | 7/1989 | Yasuda et al. ............... 473/225 |
| 6,853,304 B2 | * | 2/2005 | Reisman et al. ......... 340/573.4 |

FOREIGN PATENT DOCUMENTS

| JP | A-01-212368 | 8/1989 |
|---|---|---|
| JP | A-2001-257592 | 9/2001 |

* cited by examiner

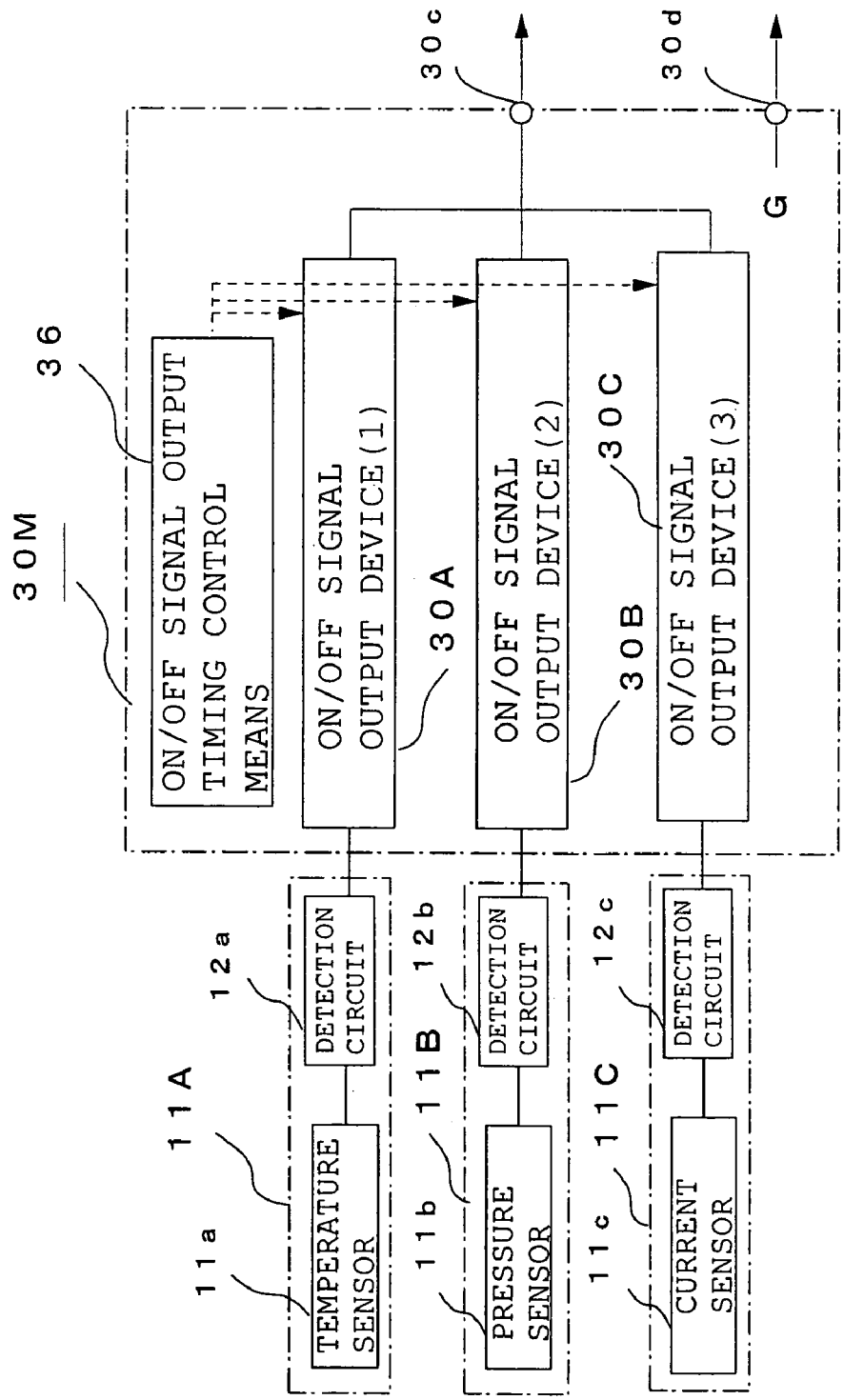

MEASUREMENT VALUE OUTPUT DEVICE, MEASUREMENT VALUE MONITORING DEVICE, CURRENT VALUE OUTPUT DEVICE AND CURRENT MONITORING DEVICE

BACKGROUND OF THE INVENTION

1. Field of the Invention

The present invention relates to a device for receiving an information signal indicative of a current, displacement or pressure measured by a meter or sensor and outputting the above measurement value and to a current monitoring device comprising the above device.

2. Description of the Prior Art

In the prior art, a measurement value output device for measuring a current running through a conductor, the displacement of an object to be measured or the inside pressure of a container measures a current, displacement or pressure by means of a sensor such as a current sensor, differential transformer or pressure sensor, applies the measured analog signal to a dedicated device to convert it into a digital signal indicative of the measurement value such as a current, displacement or pressure and outputs the digital signal to the outside.

For example, in a current value output device 60 for use in a device for monitoring the motor of a production line as shown in FIG. 14, an AC current "i" running through the power line 2 of a motor 1 is measured by current measurement means 61, this measured current signal is amplified by a detection circuit 62 to detect the above current value, the signal is applied to an A/D converter 63 to convert it into a digital signal, and the current value converted into the digital signal by the A/D converter 63 is output to current monitoring means 80 through a microcomputer 70 to monitor a time change in the measured current value.

However, since the size (measurement value) of the detected current is output as a digital value in the current value output device 60 of the prior art, a dedicated device such as the above A/D converter 63 is required and at least eight connection lines for connecting the dedicated device to the microcomputer 70, which depends on the accuracy of the measurement value, are necessary, thereby taking time and labor for wiring.

In an application field where real-time measurement is not necessary, such as the monitoring of the motor current of a production line, as shown in FIG. 15, the monitoring of a current value at predetermined time intervals suffices and the above device for outputting the measurement value (current value) all the time is not efficient.

It is an object of the present invention which has been made in view of the above problems of the prior art to provide a measurement value output device which is used to monitor a measurement value at predetermined time intervals, a measurement value monitoring device for monitoring the above output value, a current value output device for outputting a current value running through a power line at predetermined time intervals, and a current monitoring device for monitoring the above current value.

SUMMARY OF THE INVENTION

The inventors of the present invention have conducted intensive studies and have found that the above object can be attained by outputting a measurement value detected by a sensor not as an analog signal continuously but as a pulse signal (digital signal) at predetermined time intervals and expressing information on the above measurement value by the pulse width of the above pulse signal. The present invention has been accomplished based on this finding.

That is, according to a first aspect of the present invention, there is provided a measurement value output device comprising signal converting means for receiving a measurement value obtained by a meter or sensor and converting it into a time width corresponding to the measurement value and measurement value output means for outputting an ON/OFF signal which is kept ON or OFF for a time corresponding to the above time width at predetermined time intervals. Thereby, a signal indicative of the measurement value can be output at predetermined time intervals with a simple structure.

According to a second aspect of the present invention, there is provided a measurement value output device, wherein input signal switching means which is connected to a plurality of meters or sensors, selects one from outputs from the meters or sensors and outputs it to the signal converting means is installed before the signal converting means. Thereby, signals indicative of the measurement values of the meters or sensors can be output.

According to a third aspect of the present invention, there is provided a measurement value output device comprising a plurality of measurement value converters, each having signal converting means for receiving a measurement value obtained by a meter or sensor and converting it into a time width corresponding to the measurement value and measurement value output means for outputting an ON/OFF signal which is kept ON or OFF for a time corresponding to the above time width at predetermined time intervals, in order to output a plurality of the above converted ON/OFF signals at predetermined time intervals sequentially. Thereby, a plurality of signals indicative of measurement values can be output at predetermined time intervals with a simple structure.

According to a fourth aspect of the present invention, there is provided a measurement value output device, wherein a pulse signal indicative of the measurement value is output before the above ON/OFF signal.

According to a fifth aspect of the present invention, there is provided a measurement value monitoring device comprising the measurement value output device of any one of the above first to fourth aspects and monitoring means for monitoring the length of the ON time or OFF time of an ON/OFF signal output from the output device.

According to a sixth aspect of the present invention, there is provided a current value output device comprising current measuring means for measuring a current running through a conductor and ON/OFF signal output means for outputting an ON/OFF signal which is kept ON or OFF for a time corresponding to the measured current at predetermined time intervals.

According to a seventh aspect of the present invention, there is provided a current value output device having a plurality of current value converters, each comprising current measuring means for measuring a current running through a conductor and ON/OFF signal output means for outputting an ON/OFF signal which is kept ON or OFF for a time corresponding to the measured current at predetermined time intervals, in order to output a plurality of the converted ON/OFF signals at predetermined time intervals sequentially.

According to an eighth aspect of the present invention, there is provided a current value output device, wherein a pulse signal indicative of an object to be detected is output before the above ON/OFF signal.

According to a ninth aspect of the present invention, there is provided a current monitoring device comprising the current value output device of any one of the sixth to eighth aspects and monitoring means for monitoring the length of the ON time or OFF time of an ON/OFF signal output from this current value output device.

According to a tenth aspect of the present invention, there is provided a current monitoring device comprising means of outputting a pulse signal when the ON time or OFF time of the ON/OFF signal is longer than a predetermined time, means of integrating the number of the output pulses, and alarm means for issuing a warning when the integrated number of pulses exceeds a predetermined value.

BRIEF DESCRIPTION OF THE DRAWINGS

FIG. 9 is a diagram of another current value output device according to the present invention;

DETAILED DESCRIPTION OF THE PREFERRED EMBODIMENT

Preferred embodiments of the present invention will be described hereinbelow with reference to the accompanying drawings.

Embodiment 1

Figure 1:
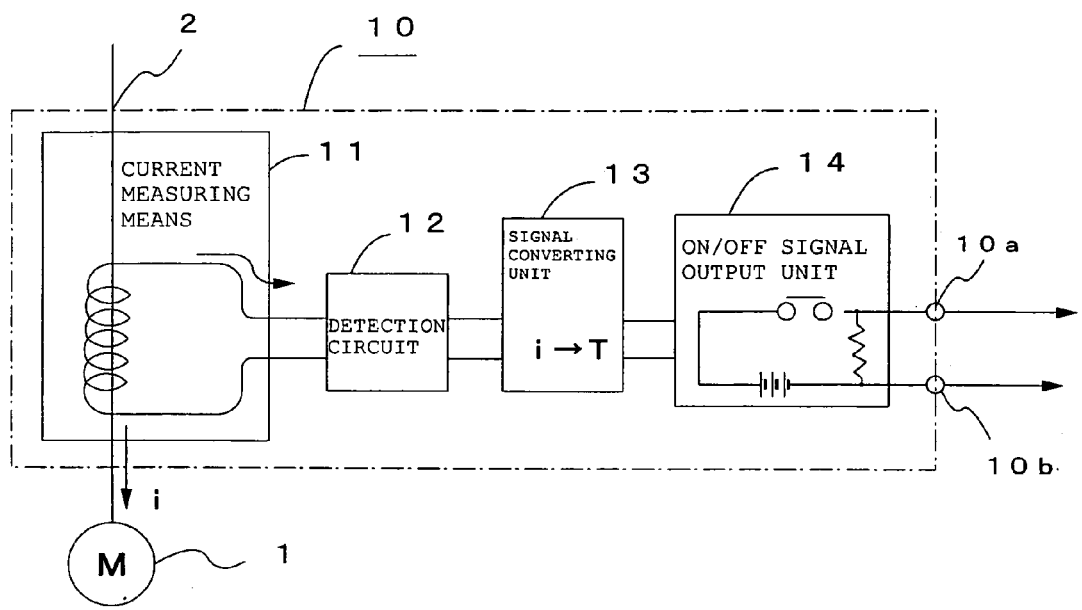
FIG. 1 is a functional block diagram showing the constitution of a current value output device according to Embodiment 1 of the present invention.

FIG. 1 is a diagram showing the constitution of a current value output device 10 according to Embodiment 1. In FIG. 1, reference numeral 11 denotes current measuring means for measuring a current running through the power line 2 of a motor 1, 12 a detection circuit for detecting a current value by amplifying the above measured current signal, 13 a signal converting unit for converting the detected current value into a time interval (duration), and 14 an ON/OFF signal output unit for outputting an ON/OFF signal which is kept ON or OFF for the above time interval at predetermined time intervals.

The current value output device 10 constituted as described above outputs the detected current value as a single pulse signal (ON/OFF digital signal). That is, information on the above current value is expressed by the pulse width of the above pulse signal.

Figure 2:
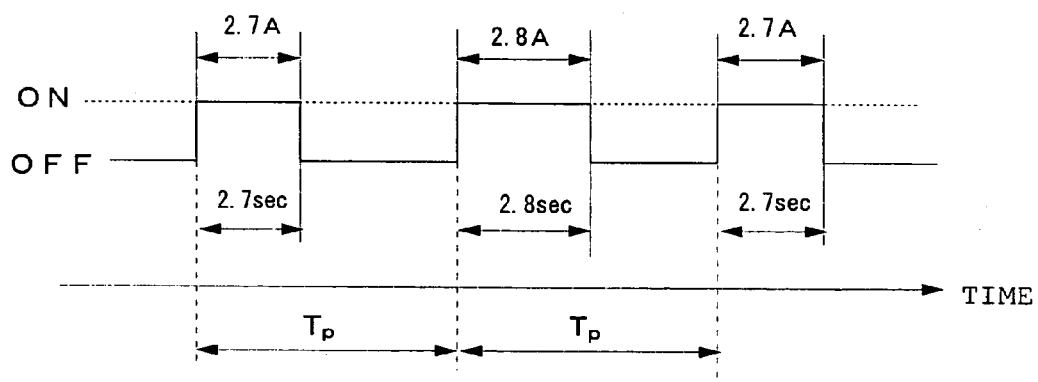
FIG. 2 is a diagram showing the operation of the current value output device according to Embodiment 1 of the present invention.

More specifically, the current value output device 10 changes its output level from an OFF state to an ON state at predetermined time Tp interval and returns its output to an OFF state from an ON state after the passage of a duration corresponding to the current value calculated by the above signal converting unit 13. Thereby, as shown in FIG. 2, when the current value is changed to 2.7 A, 2.8 A and 2.7 A, ON/OFF signals (pulse signals) having durations (pulse widths) of 2.7 sec, 2.8 sec and 2.7 sec are output from output terminals 10a and 10b at predetermined time Tp intervals.

Since the current value output device 10 of this embodiment outputs the measurement value as a binary signal, when it is connected to a microcomputer, only two connection lines (one signal line) are necessary.

Figure 3:
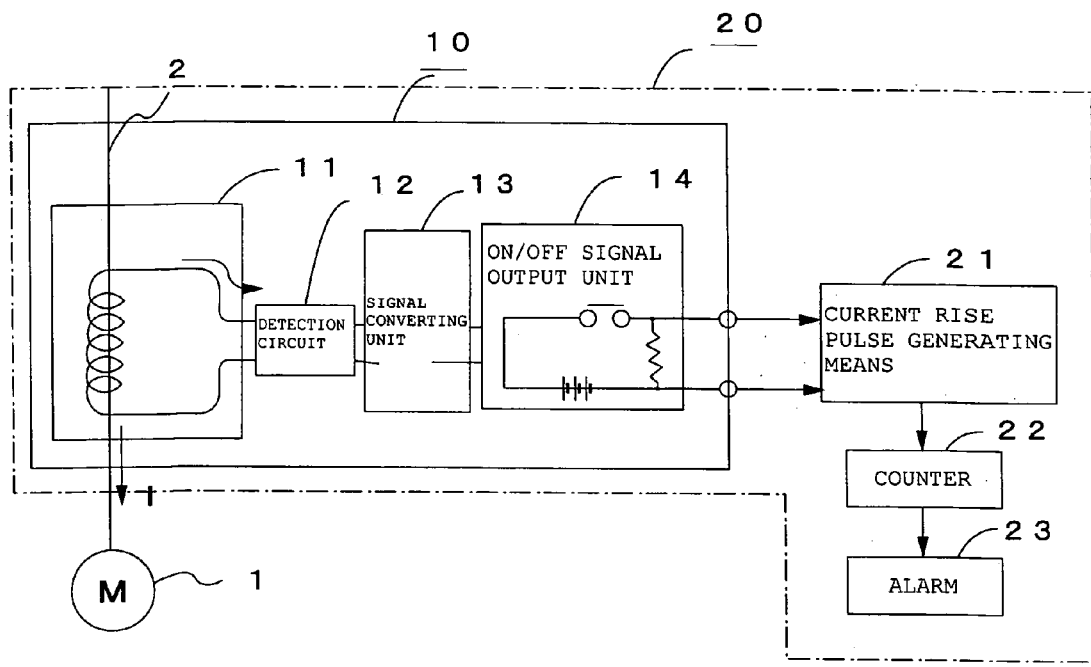
FIG. 3 is a diagram showing the constitution of a power current monitoring device according to the present invention.

By using the current value output device 10 of the present invention, a power current monitoring device 20 as shown in FIG. 3 can be constructed.

The power current monitoring device 20 comprises the above current value output device 10 which measures the current value of the power line 2 of a drive unit such as a motor 1, outputs it as an ON/OFF signal Pk and monitors the length of the ON time of this ON/OFF signal Pk to monitor the motor current. More specifically, the power current monitoring device 20 comprises current rise pulse generating means 21 for outputting a pulse signal when the ON time of the above ON/OFF signal continues for a predetermined time or longer, a counter 22 for totaling the number of the output pulses, and an alarm 23 for issuing a warning when the total number of pulses counted by the counter 22 exceeds a predetermined value, all of which are arranged after the above current value output device 10. Thus, the power current monitoring device 20 monitors a motor current based on the output value of the above current value output device 10 and issues a warning when a current running through the above power line 2 continues to rise for a predetermined time.

Figure 4:
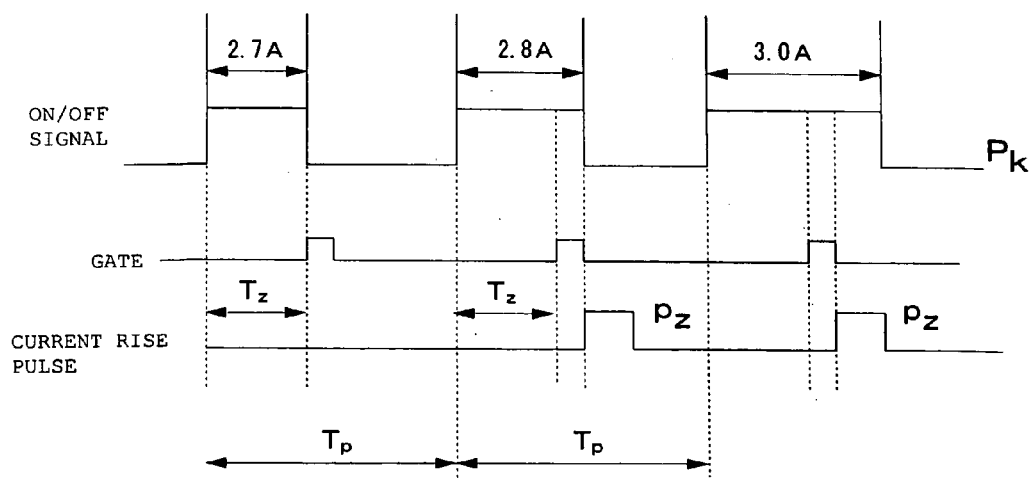
FIG. 4 is a diagram showing the operation of the power current monitoring device according to the present invention.

Various structures are conceivable for the above current rise pulse generating means 21. For example, as shown in FIG. 4, a gate is opened after a predetermined time Tz corresponding to a specified current value or allowable current value from a rise in the above ON/OF signal Pk. It is judged that a current value running through the above power line is increasing when the above ON/OFF signal Pk is still kept ON and a current rise pulse Pz is generated and applied to the counter 22. It is judged that a current value remains unchanged when the above ON/OFF signal Pk is returned to OFF, and the pulse signal is not counted.

The counter 22 counts the number of the above output pulses. When the count value exceeds a predetermined value, the alarm 23 is activated to issue a warning, thereby making it possible to warn an operator of an abnormal rise in the current running through the power line 2 of the motor 1.

Means for monitoring the length of the ON time or OFF time of the above ON/OFF signal Pk is composed of the above current rise pulse generating means 21 and the counter 22 and may be another means of monitoring the total value of the above ON time or OFF time.

According to Embodiment 1, the current value output device 10 comprises current measuring means 11 for measuring an AC current running through the power line 2 of the motor 1, detection circuit 12 for detecting a current value by amplifying the above measured current signal, a signal converting unit 13 for converting the detected current value into a time interval (duration), and an ON/OF signal output unit 14 for outputting an ON/OFF signal which is kept ON or OFF for the above time interval at predetermined time intervals and outputs a pulse signal (digital signal) having a pulse width corresponding to the above current value at predetermined time intervals. Therefore, a signal indicative of the measurement value can be output at predetermined time intervals with a simple structure.

By using the above current value output device 10 constituted as described above, a power current monitoring device for monitoring a rise in the current value running through the power line can be constructed. Since a signal output from the above current value output device 10 is a binary signal, only two connection lines are needed to connect the current value output device 10 to the current monitoring means 20, thereby making it possible to simplify the structure of the device.

In the above Embodiment 1, the current value output device 10 incorporating the current measuring means 11 and the detection circuit 12 has been described. In general, a current value measured by the measuring means is standardized, for example, 0 to 5 A or 0 to 1 A in the case of a motor current, and its output value (measurement signal) is calculated as voltage and output in most cases.

Figure 5:
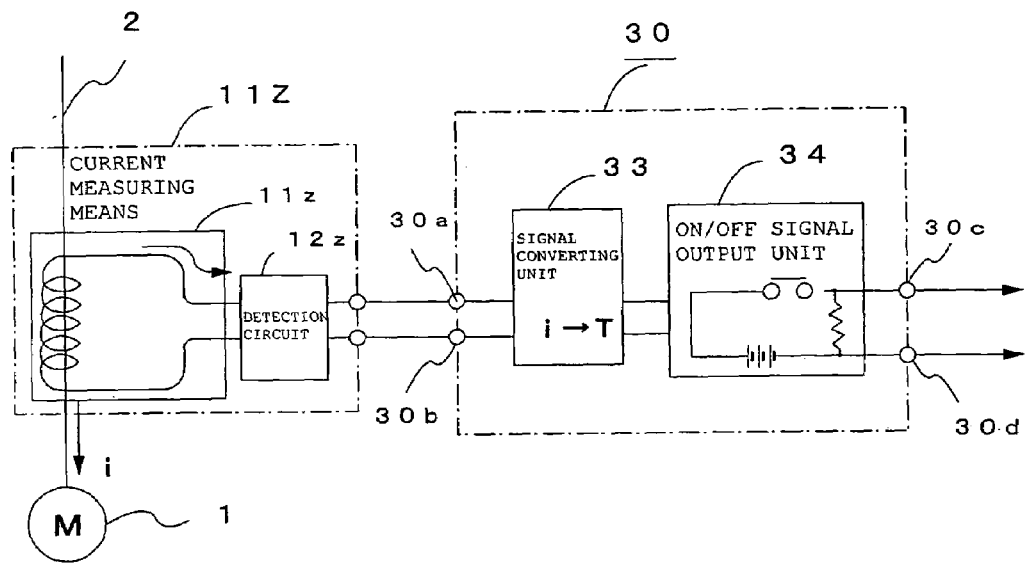
FIG. 5 is a diagram showing another current value output device according to the present invention.

Therefore, a measurement value such as the measured current value of a motor can be output as the above ON/OFF signal by using a meter output device 30 comprising a signal converting unit 33 for receiving the measurement value and converting it into a time width corresponding to the value and an ON/OFF signal output unit 34 for outputting an ON/OFF signal which is kept ON or OFF for a time corresponding to the above time width at predetermined time intervals, as shown in FIG. 5.

Stated more specifically, when current measuring means 11Z comprises a current sensor 11z and a detection circuit 12z for converting a current value detected by the above current sensor 11z into voltage, voltage output from the detection circuit 12z of the above current measuring means 11Z is applied to the above signal converting unit 33 from input terminals 30a and 30b to be converted into a time interval corresponding to the above voltage and applied to the ON/OFF signal output unit 34 so that an ON/OFF signal which is kept ON or OFF for the time interval corresponding to the above current value is output from output terminals 30c and 30d.

Figure 6:
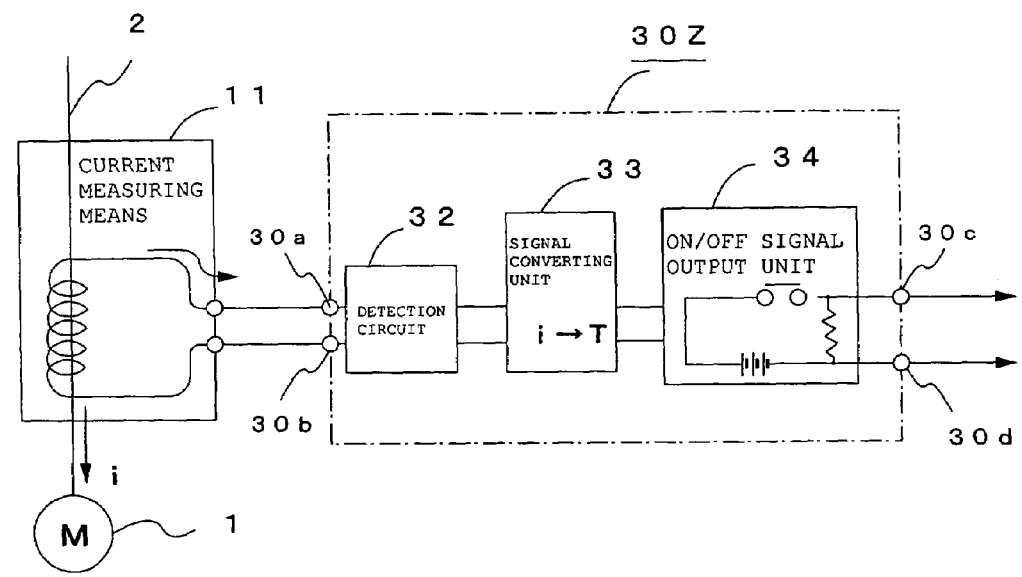
FIG. 6 is a diagram showing still another current value output device according to the present invention.

Alternatively, as shown in FIG. 6, a meter output device 30Z incorporating only a detection circuit 32 may be constructed. In this meter output device 30Z, a current signal measured by current measuring means 11 is applied to the detection circuit 32 which then amplifies the current signal to detect its current value (conversion into voltage) and supplies it to the above signal converting unit 33. The subsequent operation is the same as the above current value output device 10 and the meter output device 30 and therefore its description is omitted.

In the above Embodiment, the current value output device 10 for outputting the measurement value of a current running through a conductor and the meter output devices 30 and 30Z for receiving a current signal measured by the current measuring means 11 and outputting it as a measurement current value have been described. The present invention is not limited to these and may be applied to a measurement value output device for outputting a measurement value such as a displacement, the inside pressure of a container or a temperature measured by a differential transformer, pressure sensor or temperature sensor, respectively.

An output device for outputting a frequency value obtained by F-V converting a frequency measured by a meter can also be constructed.

Embodiment 2

In the above Embodiment 1, an output device for outputting a measurement value measured by a single meter such as the current measuring means 11 or sensor has been described. An output device for outputting a measurement value measured by a plurality of meters or sensors can be constructed by using a plurality of the above meter output devices 30 or 30Z.

Figure 7:
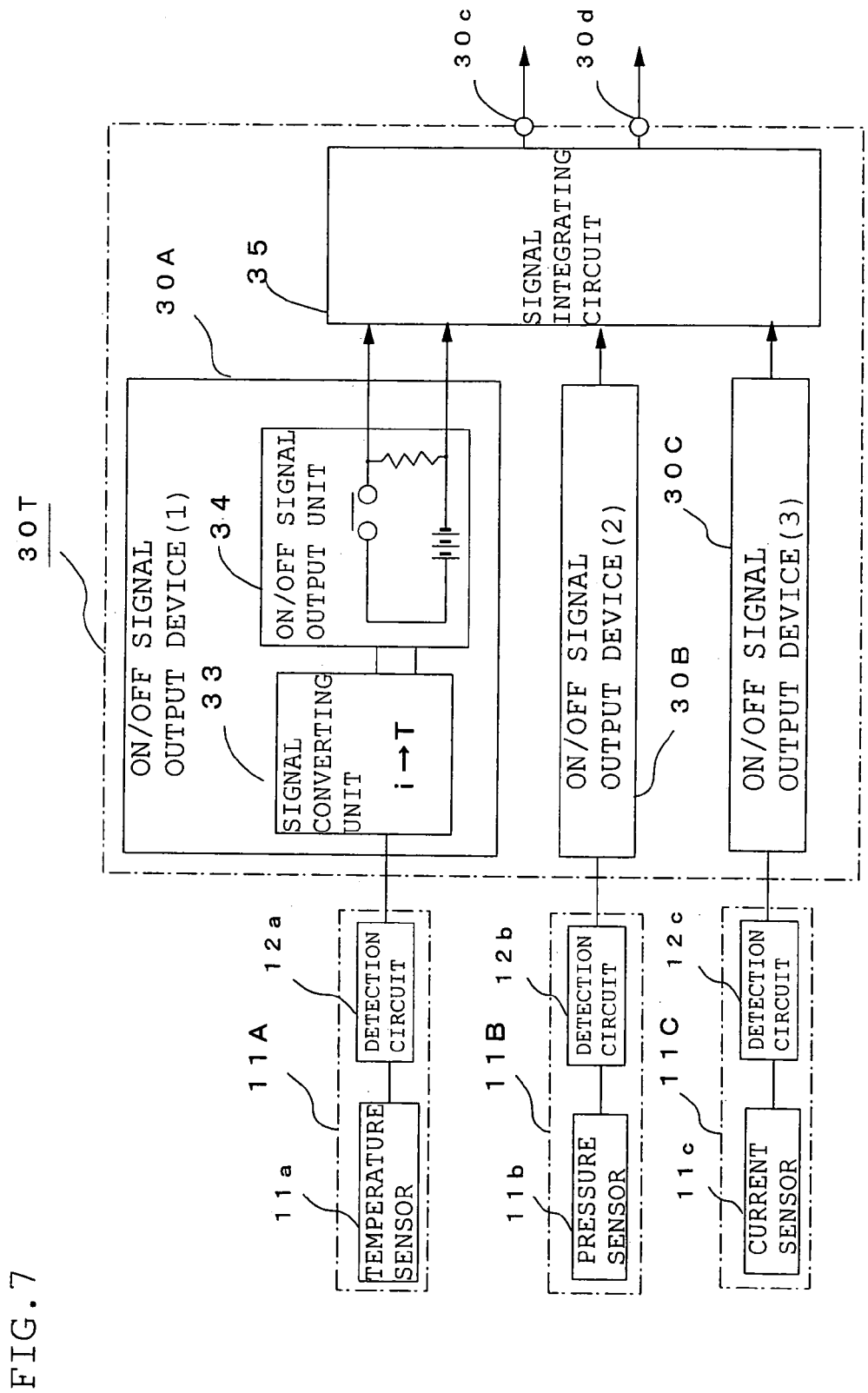
FIG. 7 is a functional block diagram showing the constitution of a current value output device according to Embodiment 2 of the present invention.

FIG. 7 is a diagram showing the constitution of a measurement value output device 30T according to this Embodiment 2. Reference symbols 30A to 30C denote ON/OFF signal output units which are measurement value converters comprising signal converting units 33 for converting measurement values measured by a plurality of meters 11A to 11C into time intervals (durations) and ON/OFF signal output means 34 for outputting ON/OFF signals which are kept ON or OFF for the above time intervals at predetermined time intervals, respectively, 35 a signal integrating circuit for integrating the outputs of the above ON/OFF signal output units 30A to 30C and outputting ON/OFF signals indicative of the measurement values of the above meters 11A to 11C at predetermined time intervals, and 30c and 30d the output terminals of the signal integrating circuit 35.

The above meters 11A to 11C may be a thermometer having a temperature sensor 11a for measuring the inside temperature of an unshown pressure device and a detection circuit 12a, a pressure meter having a pressure sensor 11b for measuring the inside pressure of the above pressure device and a detection circuit 12b, and a current meter having a current sensor 11c for measuring a current to be supplied to the pressure device and a detection circuit 12c and output temperature, pressure and current measurement values as analog signals.

The above ON/OFF signal output devices 30A to 30C output each of the measurement values such as detected temperature, pressure and current values as a single pulse digital signal (ON/OFF signal) and express information on each of the above measurement values by the pulse width of the above pulse signal.

Figure 8A:
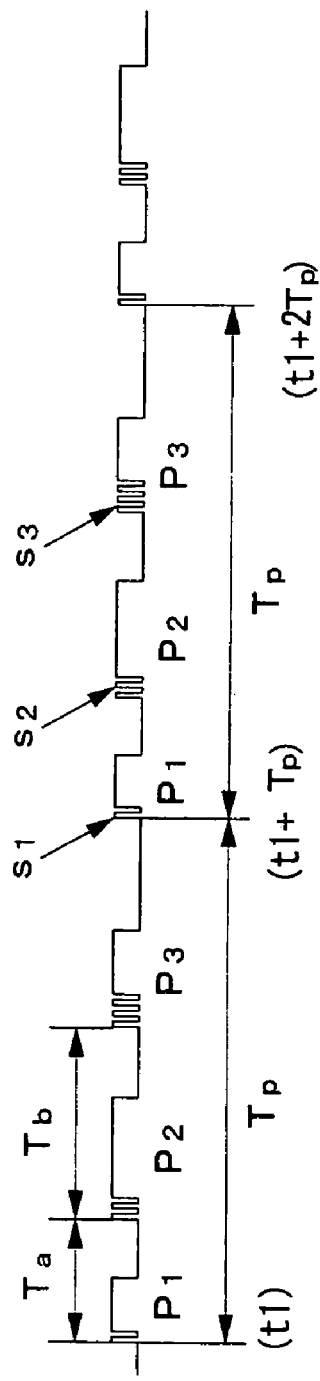
FIGS. 8(a) and 8(b) are diagrams showing the operation of the current value output device according to Embodiment 2 of the present invention.
Figure 8B:
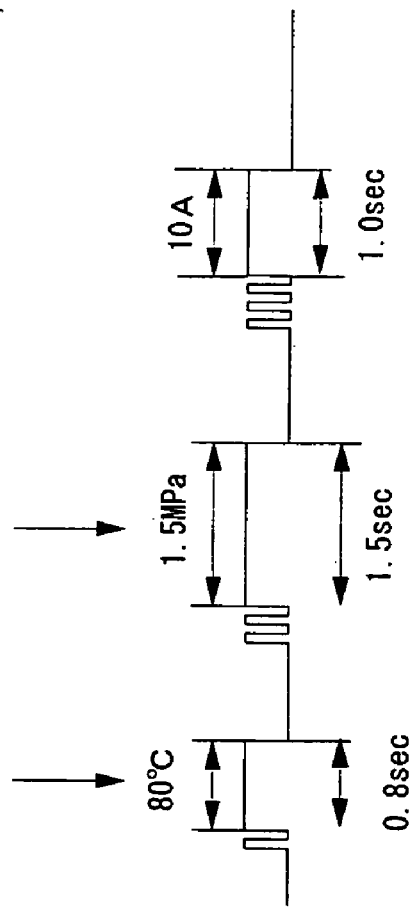

More specifically, the above ON/OFF signal output devices 30A to 30C change their output levels from an OFF state to an ON state at predetermined time intervals and return their output levels from an ON state to an OFF state after the passage of a duration corresponding to the measurement value calculated by the above signal converting unit 33, and the signal integrating circuit 35 integrates the above ON/OFF signals and outputs the above ON/OFF signals at predetermined time intervals as shown in FIGS. 8(*a*) and 8(*b*).

For example, when the temperature is 80° C., the pressure is 1.5 MPa, and the current value is 10 A at a time $t_1$ and the temperature is 90° C., the pressure is 1.6 MPa and the current value is 12 A at a measurement time $t_1$+Tp after the passage of a predetermined time Tp, the measurement value output device 30T outputs an ON/OFF signal (pulse signal) $P_1$ having a pulse width of 0.8 sec corresponding to a temperature of 80° C. at the time $t_1$, an ON/OFF signal $P_2$ having a pulse width of 1.5 sec corresponding to a pressure of 1.5 MPa after a time interval Ta from the above ON/OFF signal $P_1$ and further an ON/OFF signal $P_3$ having a pulse width of 1.0 sec corresponding to a current value of 10 A after a time interval Tb from the above ON/OFF signal $P_2$ from the output terminals 30c and 30d.

ON/OFF signals $P_1$, $P_2$ and $P_3$ having pulse widths corresponding to the above temperature (90° C.), pressure (1.6 MPa) and current value (12A) measured at the time $t_1$+Tp are output at a time $t_1$+Tp after the passage of a predetermined time Tp from the above ON/OFF signal $P_1$ (Tp>>Ta, Tb).

When pulse signals (start bits) $s_1$, $s_2$ and $s_3$ having small pulse widths corresponding to the above measurement values are output before the above ON/OFF signals $P_1$, $P_2$ and $P_3$, it is possible to clearly see which measurement values the above output ON/OFF signals $P_1$, $P_2$ and $P_3$ represent.

The measurement value output device 30T of this Embodiment 2 comprises the ON/OFF signal output means 30A to 30C which convert measurement values measured by a plurality of meters 11A to 11C into time intervals and output ON/OFF signals which are kept ON or OFF for the above respective time intervals at predetermined time intervals sequentially and a signal integrating circuit 35 which integrates the outputs of the above ON/OFF signal output means 30A to 30C to output ON/OFF signals at predetermined time intervals sequentially in order to output a plurality of ON/OFF signals indicative of the respective measurement values at predetermined time intervals. Therefore, a plurality of measurement values used for monitoring or the like can be output at predetermined time intervals with a simple structure.

Since the measurement value output device 30T outputs ON/OFF signals $P_1$, $P_2$ and $P_3$ having pulse widths indicative of the respective measurement values sequentially, only two connection lines (one signal line) are needed to connect it to a microcomputer. Therefore, the device is extremely advantageous in terms of equipment cost as compared with the prior art method.

In the above Embodiment 2, the signal integrating circuit 35 is used to output the above ON/OFF signals $P_1$, $P_2$ and $P_3$ sequentially. A measurement value output device 30 M having ON/OFF signal output timing control means 36 for controlling the output timings of the ON/OFF signals $P_1$, $P_2$ and $P_3$ in place of the above signal integrating circuit 35 as shown in FIG. 9 may be used to obtain the same effect.

When the above ON/OFF signal output timing control means 36 controls the ON/OFF signal output devices 30A to 30C such that the first ON/OFF signal output device 30A for outputting a temperature measurement value outputs an ON/OFF signal $P_1$ from the output terminals 30c and 30d at predetermined time Tp intervals, the second ON/OFF signal output device 30B for outputting a pressure measurement value outputs an ON/OFF signal $P_2$ at predetermined time Tp+Ta intervals, and the third ON/OFF signal output device 30C for outputting a current measurement value outputs an ON/OFF signal $P_3$ at predetermined time Tp+Ta+Tb intervals, the same ON/OFF signals as shown in FIG. 8 can be output.

Embodiment 3

In the above Embodiment 2, a plurality of measurement values of a single device (pressure device) are output sequentially. Measurement values from a plurality of devices can be output sequentially. Further, monitoring means for monitoring the length of the ON time or OFF time of each of ON/OFF signals from the above measurement value output device 30T or 30M may be used to constitute a measurement value monitoring device for monitoring measurement values.

Figure 10:
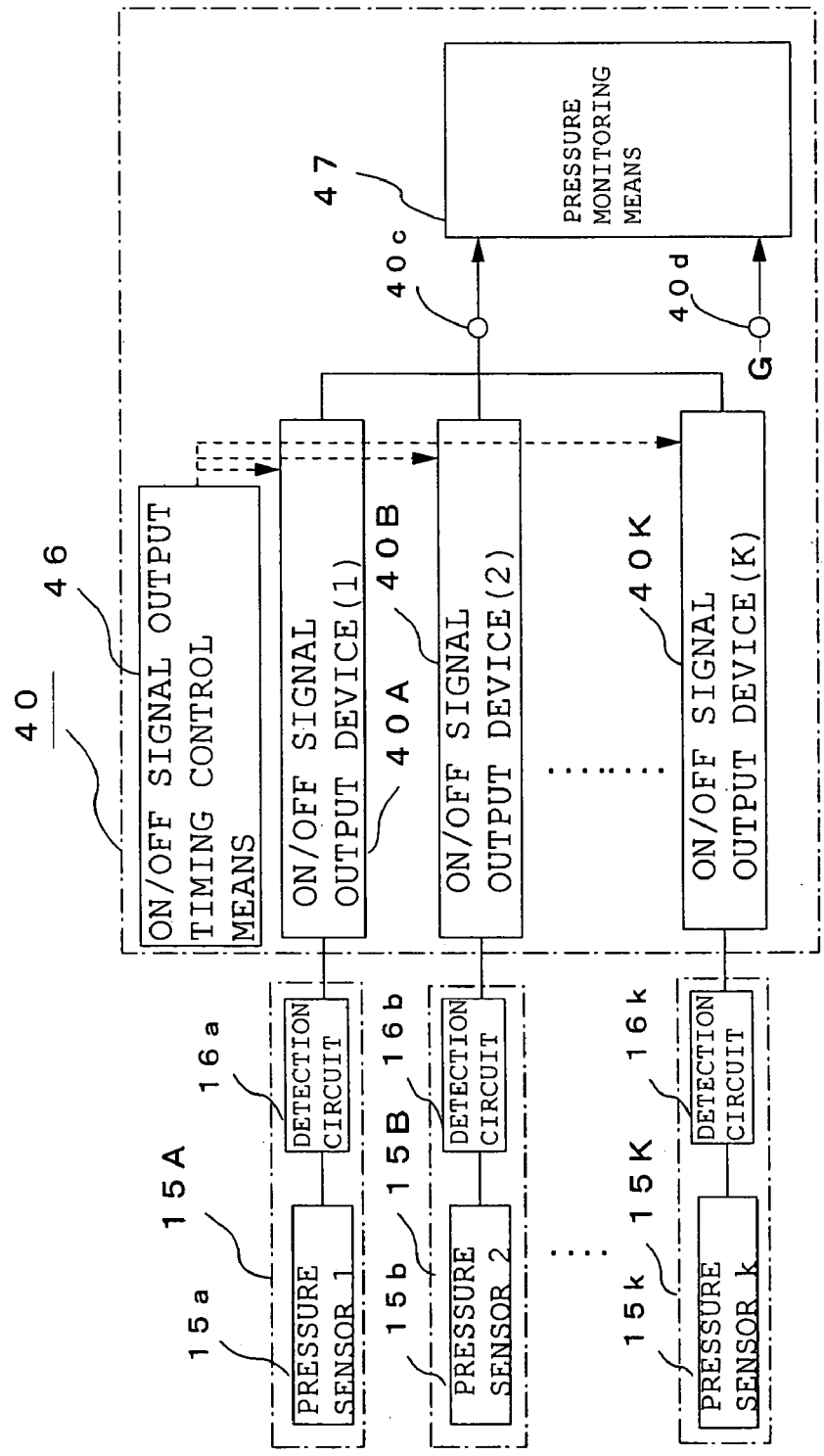
FIG. 10 is a diagram showing the constitution of a pressure monitoring device according to Embodiment 3 of the present invention.
Figure 11:
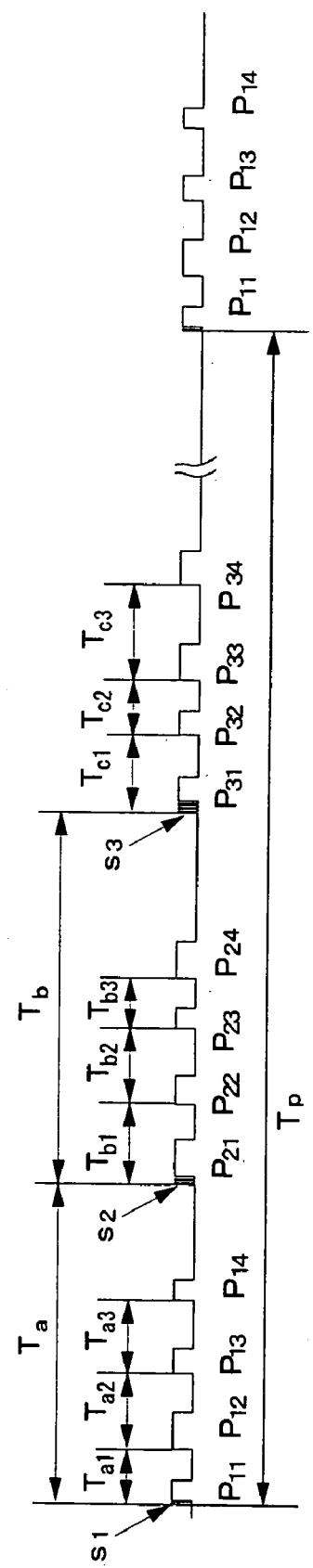
FIG. 11 is a diagram showing the operation of the pressure monitoring device according to Embodiment 3 of the present invention.

FIG. 10 is a diagram showing the constitution of a pressure monitoring device 40 as an example of the above device. This pressure monitoring device 40 for monitoring the pressures of a k number of unshown molding machines at predetermined time intervals comprises pressure sensors 15a, 15b, . . . and 15k, and detection circuits 16a, 16b, . . . and 16k for the k number of molding machines. In this pressure monitoring device 40, ON/OFF signal output devices 40A to 40K having the same constitution as the above ON/OFF signal output device 30 output pressure values detected by pressure detection devices 15A to 15K for outputting detected pressure values as analog signals as ON/OFF signals having pulse widths corresponding to the respective detected pressure values. ON/OFF signal output timing control means similar to that used in the above measurement value output device 30M is used to output a series of pulses shown in FIG. 11 to pressure monitoring means 47 for monitoring the length of the ON time or OFF time of each of the above ON/OFF signals from output terminals 40a and 40b. The pressure monitoring means 47 monitors the length of ON time or OFF time of each of the above ON/OFF signals to monitor the pressure measurement values of the k number of the molding machines.

As a series of the above ON/OFF pulse signals, a start bit may be provided to each of the outputs of the molding machines. The molding machines may be divided into several groups according to the type and setting temperature of the molding machines and start bits $s_1$, $s_2$ and $s_3$ may be provided to the respective groups in order to output ON/OFF signals of each group.

Figure 12:
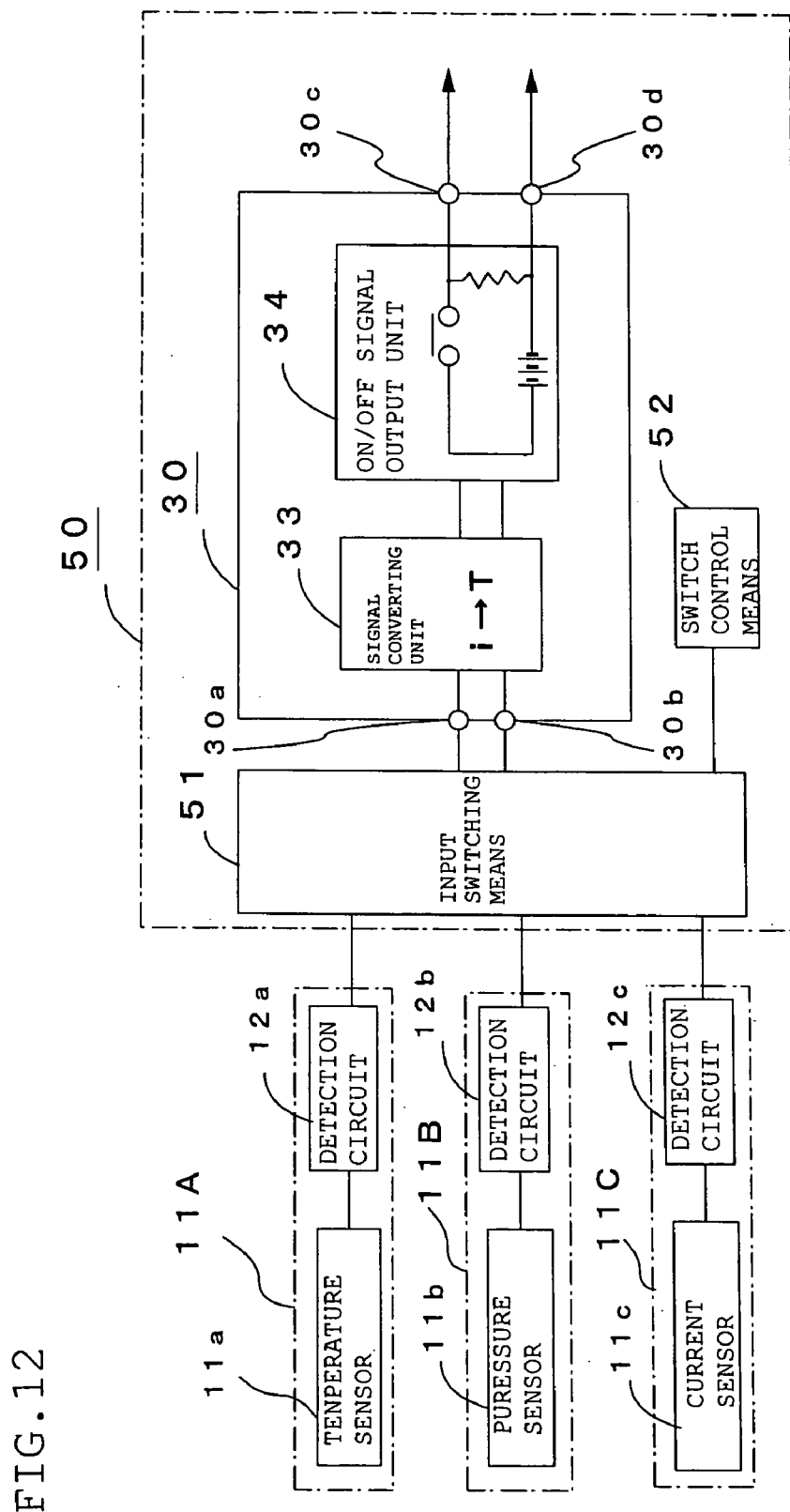
FIG. 12 is a diagram of another current value output device according to the present invention.

In the above Embodiments 2 and 3, a plurality of ON/OFF signal output devices 30 are used to output ON/OFF pulse signals indicative of measurement values obtained by a plurality of meters 11A to 11C. As shown in FIG. 12, a measurement value output device 50 for outputting the outputs of the above meters 11A to 11C as a series of ON/OFF pulse signals can be constructed by installing input signal switching means 51, connected to the above meters 11A to 11C, for selecting one from the outputs of the above meters 11A to 11C to supply it to the signal converting unit 33 of the ON/OFF signal output device 30 and switch control means 52 for controlling the switch operation of the above input signal switching means 51 at predetermined time intervals before the ON/OFF signal output device 30.

Figure 13:
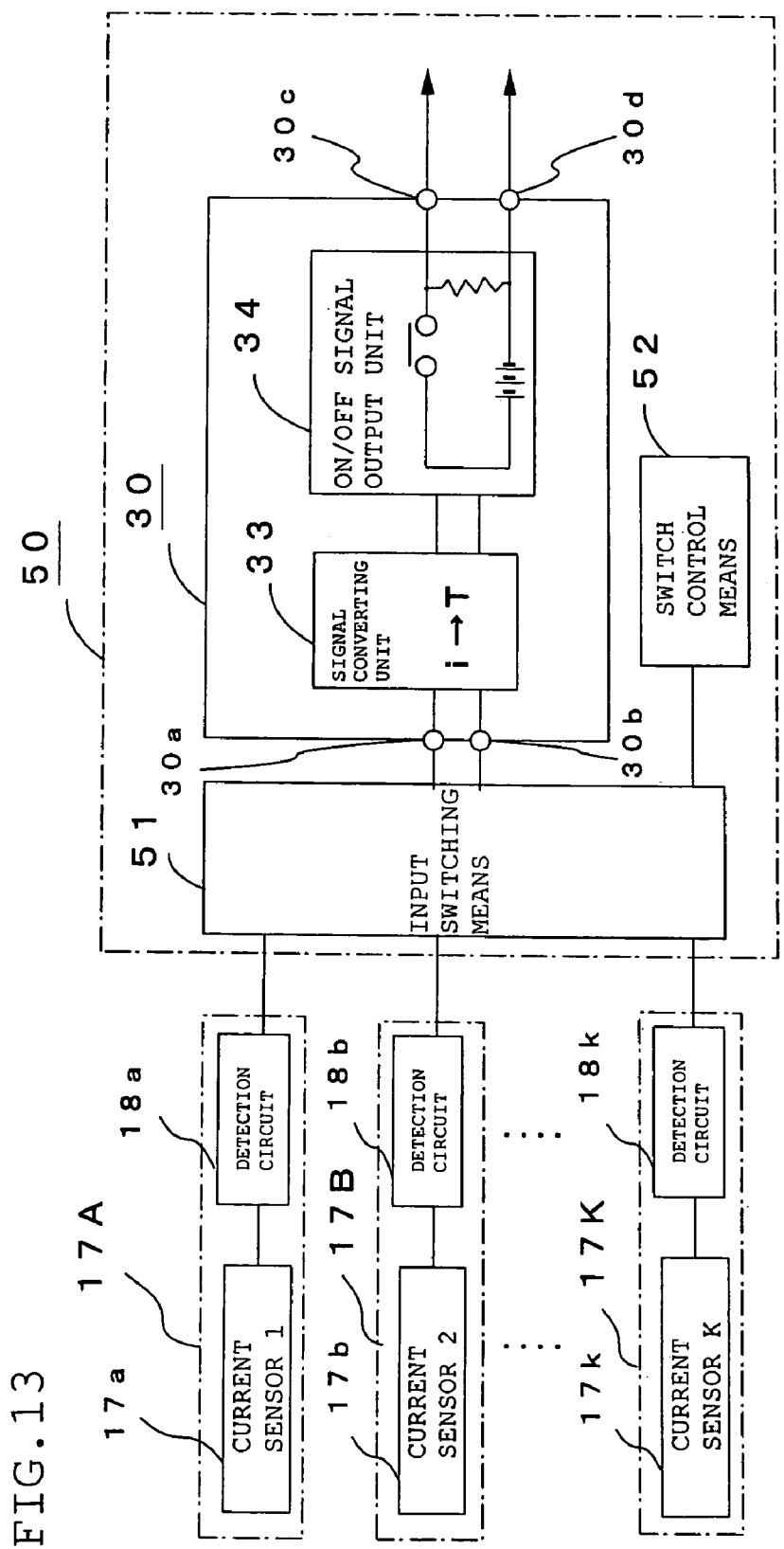
FIG. 13 is a diagram of still another current value output device according to the present invention.
Figure 14:
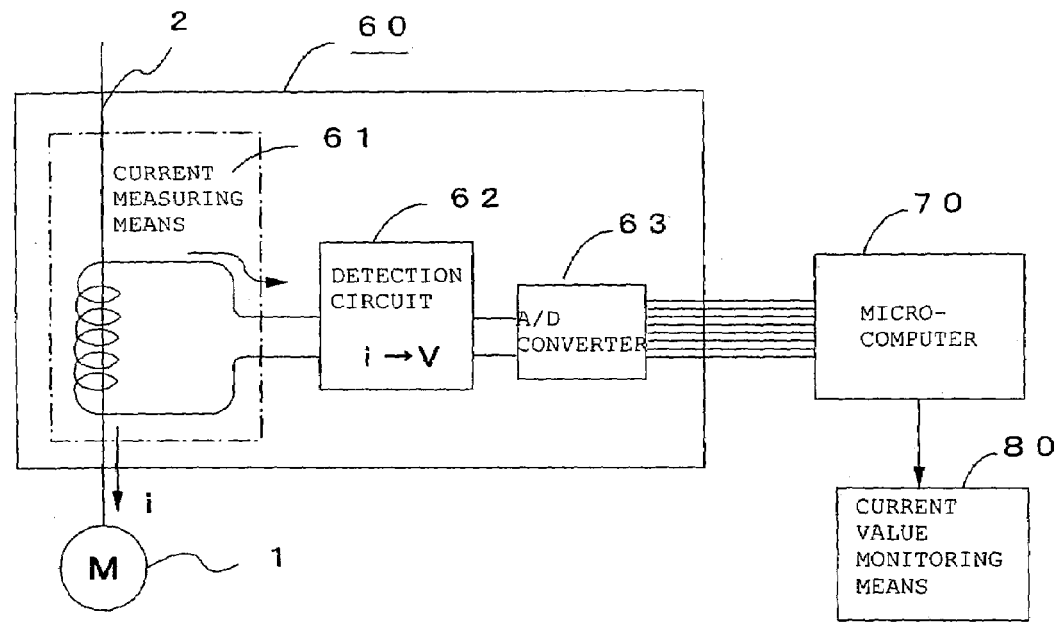
FIG. 14 is a diagram of a current value output device of the prior art.
Figure 15:
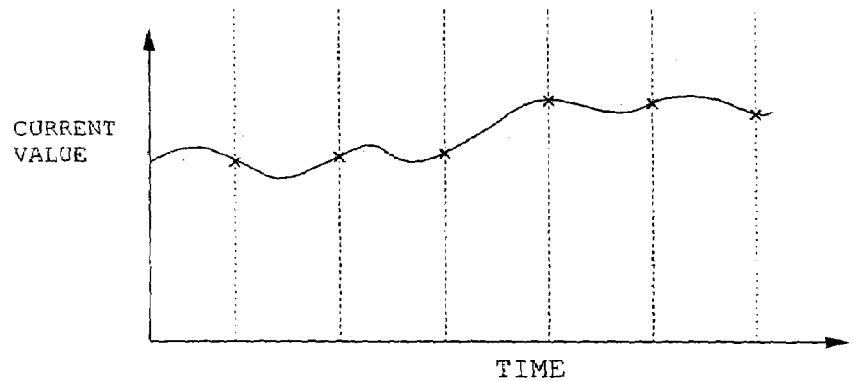
FIG. 15 is a diagram showing a method of monitoring a motor current value.

Further, as shown in FIG. 13, the current values of a k number of motors on an unshown production line are detected by current detection devices 17A to 17K having current sensors 17a, 17b, . . . and 17k and detection circuits 18a, 18b, . . . and 18k and applied to the above measurement value output device 50 to output ON/OFF pulse signals sequentially.

INDUSTRIAL FEASIBILITY

As described above, according to the present invention, a measurement value output device which can output a signal indicative of a measurement value at predetermined time intervals can be obtained by providing means for outputting an ON/OFF signal which is kept ON or OFF for a time corresponding to the measurement value at predetermined time intervals. Since a signal from the output device of the present invention is a binary signal, it can be easily connected to a microcomputer.

Since a plurality of the above measurement value output devices are provided and a plurality of the above ON/OFF signals are output sequentially at predetermined time intervals, a plurality of signals indicative different measurement values can be output at predetermined time intervals with a simple structure.

A current value output device comprising current measuring means for measuring a current running through a conductor and ON/OFF signal output means for outputting an ON/OFF signal which is kept ON or OFF for a time corresponding to the measured current at predetermined time intervals is constructed so that a current value running through the conductor can be measured and output with a simple structure.

What is claimed is:

1. A measurement value output device, comprising:
    a signal converting means for receiving a measurement value that is continuously obtained by a meter or a sensor and converting the measurement value into a time width corresponding to the measurement value, and
    a measurement value output means for changing a state of an output level from OFF to ON or ON to OFF at predetermined time intervals and for outputting an ON/OFF signal, at predetermined time intervals, that maintains the changed state of the output level as ON or OFF for a time period corresponding to the time width obtained from the signal converting means,
    wherein a magnitude of the measurement value obtained from the signal converting means is outputted using the ON/OFF signal outputted at the predetermined time intervals.

2. The measurement value output device according to claim 1, further comprising:
    an input signal switching means, wherein:
        the input signal switching means is connected to a plurality of at least one of meters and sensors,
        the input signal switching means performs a switching operation to select one of a plurality of outputs from the plurality of at least one of meters and sensors, and
        the input signal switching means outputs the selected one of the plurality of outputs to the signal converting means; and
    a switching control means for controlling the switching operation of the input signal switching means.

3. The measurement value monitoring device according to claim 2, wherein the meter or the sensor is a current measuring means for continuously measuring a current running through a conductor.

4. The measurement value output device according to claim 2, wherein a pulse signal indicative of the measurement value is output before the ON/OFF signal.

5. A measurement value monitoring device comprising the measurement value output device of claim 2 and monitoring means for monitoring a length of the ON time or OFF time of an ON/OFF signal output from the output device.

6. The measurement value monitoring device according to claim 4, wherein the meter or the sensor is a current measuring means for continuously measuring a current running through a conductor.

7. A measurement value monitoring device comprising the measurement value output device of claim 4 and monitoring means for monitoring a length of the ON time or OFF time of an ON/OFF signal output from the output device.

8. A measurement value monitoring device comprising the measurement value output device of claim 1 and monitoring means for monitoring a length of the ON time or OFF time of an ON/OFF signal output from the output device.

9. The measurement value monitoring device according to claim 8, comprising:
    means of outputting a pulse signal when the ON time or OFF time of the ON/OFF signal is longer than a predetermined time,
    means of integrating a number of the output pulses, and
    alarm means for issuing a warning when the integrated number of pulses exceeds a predetermined value.

10. The measurement value monitoring device according to claim 1, wherein the meter or the sensor is a current measuring means for continuously measuring a current running through a conductor.

11. The measurement value monitoring device according to claim 10, wherein a value of the measured current running through the conductor is the measurement value received by the signal converting means.

12. The measurement value monitoring device according to claim 11, comprising:
    means of outputting a pulse signal when the ON time or OFF time of the ON/OFF signal is longer than a predetermined time,
    means of integrating a number of the output pulses, and
    alarm means for issuing a warning when the integrated number of pulses exceeds a predetermined value.

13. A measurement value output device, comprising:
    a plurality of measurement value converters, each of the measurement value converters including:
        a signal converting means for receiving a measurement value that is continuously obtained by a meter or a sensor and converting the measurement value into a time width corresponding to the measurement values, and
        a measurement value output means for changing a state of an output level from OFF to ON or ON to OFF at predetermined time intervals and for outputting an ON/OFF signal, at predetermined time intervals, that maintains the changed state of the output level as ON or OFF for a time period corresponding to the time width obtained from the signal converting means; and
    an output timing controlling means for controlling an output timing of respective ones of the plurality of measurement value converters to sequentially output the respective ON/OFF signals at predetermined time intervals.

14. The measurement value monitoring device according to claim 13, wherein the meter or the sensor is a current measuring means for continuously measuring a current running through a conductor.

15. A measurement value monitoring device comprising the measurement value output device of claim 13 and monitoring means for monitoring a length of the ON time or OFF time of an ON/OFF signal output from the output device.

16. The measurement value output device according to claim 13, wherein a pulse signal indicative of the measurement value is output before the ON/OFF signal.

* * * * *